April 21, 1970 YUM T. CHAN 3,508,168
CRYSTAL OSCILLATOR TEMPERATURE COMPENSATING CIRCUIT
Filed May 23, 1968
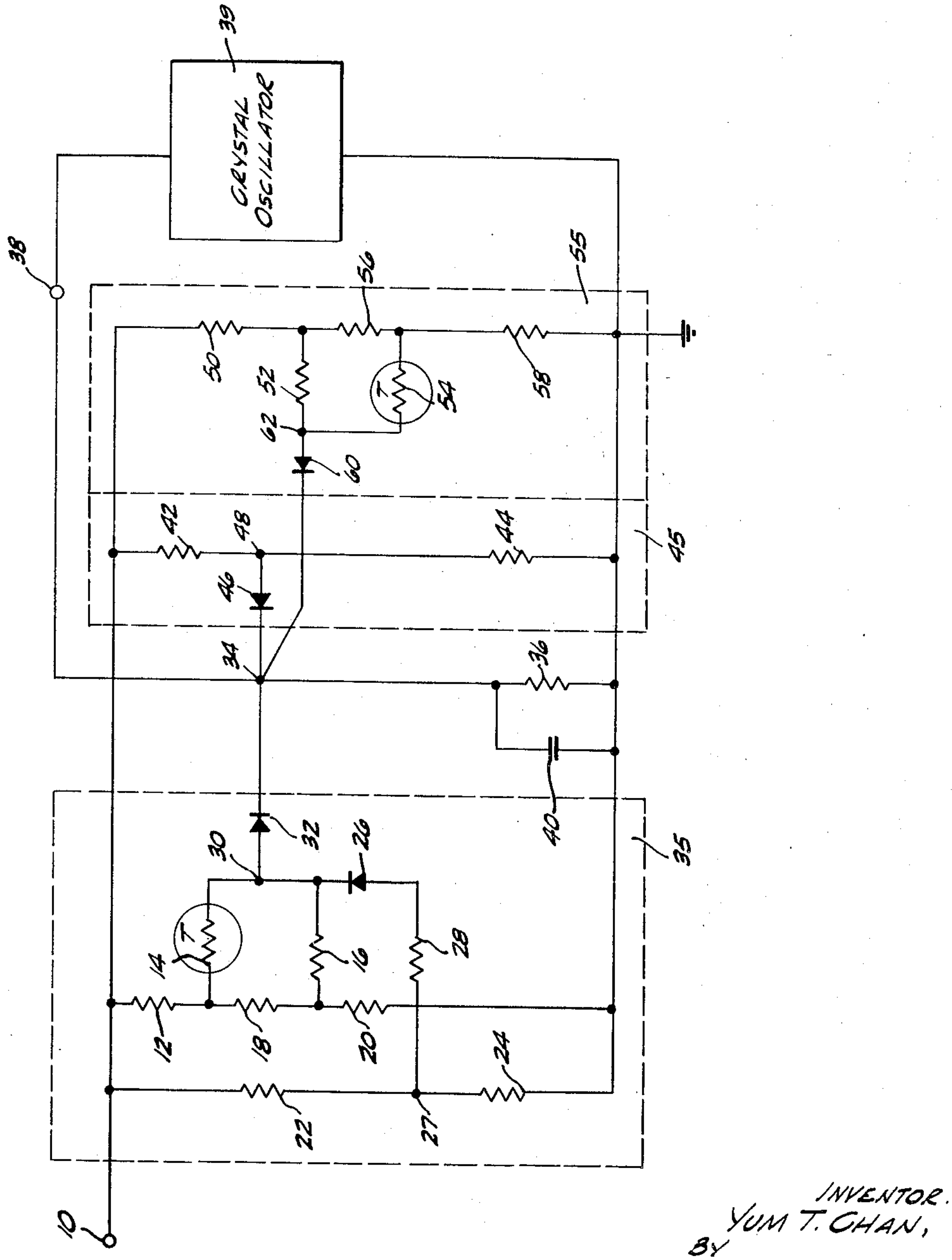
INVENTOR.
YUM T. CHAN,
BY
Paul M. Coble
ATTORNEY.

United States Patent Office 3,508,168
Patented Apr. 21, 1970

3,508,168

CRYSTAL OSCILLATOR TEMPERATURE COMPENSATING CIRCUIT

Yum T. Chan, Huntington Beach, Calif., assignor to Hughes Aircraft Company, Culver City, Calif., a corporation of Delaware Filed May 23, 1968, Ser. No. 731,498
Int. Cl. H03b 5/36
U.S. Cl. 331—116 2 Claims

ABSTRACT OF THE DISCLOSURE

In the disclosed crystal oscillator temperature compensating circuit, a plurality of voltage producing circuit portions are used to provide an overall voltage vs. temperature characteristic having (as a function of increasing temperature) a negative slope over a low temperature range, substantially zero slope over a middle temperature range, and a positive slope over a high temperature range. Each circuit portion producing a temperature dependent voltage includes a thermistor coupled in series with highly temperature stable resistors. Diodes are used to selectively electrically connect and disconnect the respective voltage producing circuit portions to the crystal oscillator to be temperature compensated.

This invention relates to temperature compensation of electronic circuits, and more particularly it relates to crystal oscillator temperature compensating circuits that insure the achievement of excellent linearity and stability in the operation of the crystal oscillators.

Crystal oscillators are often used as frequency standards or as standard time devices. However, the parameters of oscillation of the primary oscillating elements of crystal oscillators often vary with temperature. For example, the frequency vs. temperature characteristic of a piezoelectric crystal oscillator may be characterized by a positive slope at lower temperatures, a substantially zero slope at intermediate temperatures and a negative slope at higher temperatures. In the past, temperature stability was achieved by controlling the environment of the oscillator by means of an oven. This technique, however, is impractical for applications where minimum cost or space is essential.

Accordingly, it is an object of the present invention to provide a simple, effective and inexpensive temperature compensating circuit.

It is a further object of the present invention to provide a crystal oscillator temperature compensating circuit that employs temperature sensitive circuit elements to maintain the operating frequency of the crystal oscillator at a constant value over a wide range of environmental temperatures.

It is still a further object of the present invention to provide a simple and inexpensive crystal oscillator temperature compensating circuit that compensates for environmental temperature changes by changing the capacitance in an oscillator circuit.

It is another object of the present invention to provide a crystal oscillator temperature compensating circuit that generates a plurality of temperature dependent voltage signals over respective operating temperature ranges.

In accordance with the objects set forth above, a crystal oscillator temperature compensating circuit in accordance with the present invention comprises a plurality of voltage producing circuit portions. Each of the circuit portions includes temperature sensitive resistance means and substantially non-temperature sensitive resistance means coupled in series. A diode having first and second electrodes is coupled by its first electrode to the junction between the temperature sensitive resistance means and the non-temperature sensitive resistance means. The second electrode of each diode is coupled to a common point. A substantially constant voltage source is coupled across each circuit portion. For a given temperature range only one of the diodes is conductive depending on which of the several circuit portions has the highest voltage at the first electrode of its associated diode.

Other and further objects, advantages and characteristic features of the present invention will become readily apparent from the following detailed description of the invention when considered in conjunction with the accompanying drawing in which the sole figure is a schematic circuit diagram illustrating a preferred embodiment of the invention.

Referring to the figure with greater particularity, there is shown a temperature compensating circuit according to the invention having an input terminal 10 to which is applied a highly constant voltage, which for purposes of illustration may be of positive polarity. Coupled between input terminal 10 and a level of reference potential illustrated as ground are series resistors 12, 18 and 20. A thermistor 14 and a resistor 16 are coupled in series across resistor 18, the thermistor 14 being connected to resistor 12. Also, connected in series between terminal 10 and ground are resistors 22 and 24, with resistor 22 connected to terminal 10 and resistor 24 connected to ground. A resistor 28 and a diode 26 are connected in series between junction point 27 between resistors 24 and 22 and junction point 30 between thermistor 14 and resistor 16, the cathode of diode 26 being connected to the point 30. A diode 32 is connected between point 30 and a junction point 34 such that the cathode of diode 32 is connected to point 34 and the anode of diode 32 is connected to point 30. Resistors 12, 16, 18, 20, 22, 24 and 28, thermistor 14, and diodes 26 and 32 function as a first voltage producing circuit portion 35.

Resistors 42 and 44 are connected in series between terminal 10 and ground such that one terminal of resistor 42 is connected to terminal 10 and one terminal of resistor 44 is connected to ground. A diode 46 is connected between junction point 48 between resistors 42 and 44 and junction point 34, with the cathode of diode 46 connected to point 34 and the anode of diode 46 connected to point 48. Resistors 42 and 44 and diode 46 function as a second voltage producing circuit portion 45.

Resistors 50, 56 and 58 are connected in series between terminal 10 and ground, with resistor 50 connected to terminal 10 and resistor 58 connected to ground. A resistor 52 and a thermistor 54 are connected in series across resistor 56, with resistor 52 connected to resistor 50. A diode 60 is connected between junction point 62 between resistor 52 and thermistor 54 and point 34, the cathode of diode 60 being connected to point 34 and the anode of diode 60 being connected to point 62. Resistors 50, 52, 56 and 58, thermistor 54, and diode 60 function as a third voltage producing circuit portion 55.

A resistor 36 and a capacitor 40 are connected in parallel between point 34 and the ground level. Point 34 is connected to an output terminal 38 which may be connected to a crystal oscillator 39 such as the crystal oscillator shown and described in U.S. Patent 3,358,244. If the crystal oscillator of the aforementioned patent is employed, the terminal 38 would be coupled to the junction between varactor diodes 38 and 40 of this oscillator.

A circuit constructed as set forth above has achieved a stability of plus or minus 0.00011% over a temperature range from minus 30° C. to plus 65° C. using the following values for circuit components:

Resistors:

| | |
|---|---|
| **12**=1.40 K ohms | **36**=3.80 K ohms |
| **16**=4.65 K ohms | **42**=5.11 K ohms |
| **18**=6.65 K ohms | **44**=4.64 K ohms |
| **20**=3.16 K ohms | **50**=6.81 K ohms |
| **22**=3.48 K ohms | **52**=100 K ohms |
| **24**=6.19 K ohms | **56**=5.11 K ohms |
| **28**=1.00 K ohms | **58**=6.19 K ohms |

Thermistors: 14 and 54= 10.0 K ohms at 25° C.

The values of the circuit components used are dependent on the output voltage desired at point 34, and the resistors should provide a highly predictable and constant resistance over the temperature range desired for compensation. Moreover, it is understood that if the voltage applied at terminal 10 is a negative voltage, the polarity of diodes 26, 32, 46 and 60 would be reversed from that shown. Also, diodes may be substituted for thermistors 14 and 54; however, the values of the resistances must then be altered.

In the operation of the circuit of the figure, point 34, and consequently output terminal 38, is maintained at a voltage that is determined by either the first, second or third voltage producing circuit portion. The first voltage producing circuit portion 35 has circuit element values such that the voltage at point 30 is slightly lower than the voltage at point 48 at a desired temperature, for example, 0° C. The third voltage producing circuit portion 55 has circuit element values such that the voltage at point 62 is also slightly below the voltage at point 48 at the aforementioned exemplary temperature. Diodes 32, 46 and 60 are connected so that only one of the diodes is conducting at one time, the other diodes being back biased. Diodes 32, 46 and 60 each conduct when the voltage at points 30, 48 and 62, respectively, is highest.

Since the resistance of a thermistor varies non-linearly and inversely with temperature, thermistor 14 decreases in resistance as the temperature increases. A decrease in resistance of thermistor 14 raises the voltage at point 30. For an increase in temperature, thermistor 54 would also decrease in resistance and thereby lower the voltage at point 62. Resistors 16, 18, 52 and 56 minimize the effect of changes in resistance of the thermistors 14 and 54 on the total resistance of the circuit components. The voltage at point 48 remains substantially constant so long as the input voltage into terminal 10 is constant.

At low temperatures diode 60 is conducting and diodes 32 and 46 are back biased. The voltage at terminal 38 is consequently determined by the third voltage producing circuit portion 55. As the temperature increases the resistance of thermistor 54 decreases, thereby lowering the voltage at point 62 until it is lower than the voltage at point 48. When the voltage at point 62 is lower than the voltage at point 48, diode 60 is back biased (diode 32 still remaining back biased) and diode 46 conducts. The voltage at terminal 38 is consequently determined by the second voltage producing circuit portion 45. As the temperature increases further, the resistance of thermistor 14 decreases until the voltage at point 30 (which has at lower temperatures been below the voltages at points 48 and 62) is higher than the voltage at point 48. This increase in voltage at point 30 causes diode 32 to conduct and diodes 46 and 60 to be back biased. The output voltage at point 34 is then determined by the first voltage producing circuit portion 35.

The resistance vs. temperature characteristic of the thermistor 14 has a relatively large negative slope in a temperature range corresponding to the voltage that causes diode 32 to conduct and diodes 46 and 60 to be back biased; at higher temperatures the slope magnitude gradually decreases. A compensating circuit, comprising resistors 22, 24, 28 and diode 26, is employed to provide a slope of decreased magnitude in the aforementioned temperature range. When the temperature is in this range, diode 26 is forward biased and provides a substantially constant voltage at point 30 until the resistance of thermistor 14 decreases sufficiently so that diode 26 is back biased, thereby effectively disconnecting the compensating circuit.

As stated above, a piezoelectric crystal may have a frequency vs. temperature characteristic that may be characterized by a positively sloped first portion, a substantially zero sloped second portion, and a negatively sloped third portion. This corresponds substantially to the inverse of the voltage vs. temperature characteristic of voltage producing circuit portions 35, 45, and 55. By connecting a circuit having such a voltage vs. temperature characteristic to a device that has a negatively sloped capacitance vs. voltage characteristic, such as the two varactor diodes connected in series within their cathode connected together, for example, the desired frequency vs. temperature characteristic for temperature compensation of a piezoelectric crystal oscillator may be achieved since the oscillation frequency of the oscillator is substantially inversely proportional to the amount of capacitance in series with the crystal.

Although in the foregoing exemplary circuit, output terminal 38 has been described as being connected to a particular crystal oscillator circuit, it should be apparent that output terminal 38 may also be connected to any electrical component that requires substantially a U-shaped temperature compensating voltage characteristic. Moreover, the aforementioned principles may be used to synthesize any complex temperature compensating voltage characteristic by adding or subtracting voltage producing components to the circuit. Thus, various changes and modifications obvious to a person skilled in the art to which the invention pertains are deemed to be within the spirit, scope and contemplation of the invention.

What is claimed is:

1. A crystal oscillator temperature compensating circuit comprising:

an output terminal;

a first voltage producing circuit portion including a first resistor having first and second terminals, a second resistor having first and second terminals, a first thermistor and a third resistor coupled in parallel between said first terminal of said first resistor and said first terminal of said second resistor, and a first diode coupled between said first terminal of said second resistor and said output terminal;

a second voltage producing circuit portion including a fourth resistor having first and second terminals and a fifth resistor having first and second terminals coupled in series, with said first terminals of said fourth and said fifth resistors being coupled together, and a second diode coupled between the junction between said fourth and fifth resistors and said output terminal;

a third voltage producing circuit portion comprising a sixth resistor having first and second terminals, a seventh resistor having first and second terminals, a second thermistor coupled in parallel with an eighth resistor between said first terminal of said sixth resistor and said first terminal of said seventh resistor, and a third diode coupled between said first terminal of said sixth resistor and said output terminal; and a substantially constant voltage source having a first terminal coupled to said second terminal of said first resistor, to said second terminal of said fourth resistor and to said second terminal of said sixth resistor, and having another terminal coupled to said second terminal of said second resistor, to said second terminal of said fifth resistor, and to said second terminal of said seventh resistor.

2. A crystal oscillator temperature compensating circuit comprising:

an output terminal;

a first voltage producing circuit portion including a first resistor, a second resistor and a third resistor coupled in series, a first thermistor and a fourth resistor in series coupled across said second resistor, one terminal of said first thermistor being coupled to said first resistor, a first diode having a first electrode coupled to said output terminal and having a second electrode coupled to the junction between said fourth resistor and said first thermistor, a fifth and a sixth resistor coupled in series and in parallel with said first, second and third resistors, and a second diode having a first electrode coupled to said second electrode of said first diode and having a second electrode coupled to the junction between said fifth and sixth resistors;

a second voltage producing circuit component including a seventh resistor and an eighth resistor coupled in series, and a third diode having a first electrode coupled to said output terminal and having a second electrode coupled to the junction between said seventh and said eighth resistors;

a third voltage producing circuit component including a ninth resistor, a tenth resistor and an eleventh resistor coupled in series, a second thermistor and a twelfth resistor in series coupled across said tenth resistor, said second thermistor having one terminal coupled to said eleventh resistor, a fourth diode having a first electrode coupled to said output terminal and having a second electrode coupled to the junction between said second thermistor and said twelfth resistor; and a substantially constant voltage source coupled across said first, second and third resistors in series, across said fifth and sixth resistors in series, across said seventh and eighth resistors in series, and across said ninth, tenth and eleventh resistors in series.

References Cited

UNITED STATES PATENTS

| | | | |
|---|---|---|---|
| 3,054,966 | 9/1962 | Etherington | 331—176 |
| 3,373,379 | 3/1968 | Black | 331—176 |
| 3,397,367 | 8/1968 | Steel et al. | 331—176 |

JOHN KOMINSKI, Primary Examiner

U.S. Cl. X.R.

331—176